(12) United States Patent
Hantschel et al.

(10) Patent No.: US 7,550,855 B2
(45) Date of Patent: Jun. 23, 2009

(54) VERTICALLY SPACED PLURAL MICROSPRINGS

(75) Inventors: Thomas Hantschel, Moorsele (BE); Eugene M. Chow, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 175 days.

(21) Appl. No.: 11/292,474

(22) Filed: Dec. 2, 2005

(65) Prior Publication Data

US 2007/0125486 A1    Jun. 7, 2007

(51) Int. Cl.
  *H01L 23/52*    (2006.01)
  *H01L 23/48*    (2006.01)
  *B32B 37/00*    (2006.01)
  *H05K 1/02*     (2006.01)
  *G01R 31/02*    (2006.01)
  *B01L 3/02*     (2006.01)

(52) U.S. Cl. .................. 257/776; 257/784; 257/775; 257/773; 257/750; 257/735; 257/48; 257/499; 257/690; 257/696; 257/698; 257/691; 257/692; 257/693; 257/E23.014; 257/E23.043; 257/E23.021; 257/E23.078; 156/160; 156/163; 324/762

(58) Field of Classification Search ................. 257/784, 257/773, 750, 735, 776, 775, 690, 691, 692, 257/693, 696, 698, 499, 620, E23.021, E23.078, 257/E23.014, E23.043, 48, E21.529, E21.627, 257/E21.508; 156/160, 163; 324/762; 439/81, 439/66; 29/874; 430/320

See application file for complete search history.

(56) References Cited

U.S. PATENT DOCUMENTS

| | | | |
|---|---|---|---|
| 5,613,861 A | 3/1997 | Smith et al. | |
| 5,848,685 A | 12/1998 | Smith et al. | |
| 5,914,218 A | 6/1999 | Smith et al. | |
| 5,944,537 A | 8/1999 | Smith et al. | |
| 5,979,892 A | 11/1999 | Smith | |
| 6,184,065 B1 | 2/2001 | Smith et al. | |
| 6,184,699 B1 | 2/2001 | Smith et al. | |
| 6,213,789 B1 | 4/2001 | Chua et al. | |
| 6,264,477 B1 | 7/2001 | Smith et al. | |
| 6,290,510 B1 * | 9/2001 | Fork et al. | ..................... 439/81 |
| 6,299,462 B1 | 10/2001 | Biegelsen | |
| 6,352,454 B1 | 3/2002 | Kim et al. | |
| 6,361,331 B2 | 3/2002 | Fork et al. | |
| 6,392,524 B1 | 5/2002 | Biegelsen et al. | |
| 6,396,677 B1 | 5/2002 | Chua et al. | |
| 6,411,427 B1 | 6/2002 | Peeters et al. | |
| 6,439,898 B2 | 8/2002 | Chua et al. | |
| 6,504,643 B1 | 1/2003 | Peeters et al. | |
| 6,528,350 B2 * | 3/2003 | Fork | ........................... 438/117 |

(Continued)

*Primary Examiner*—Alexander O Williams
(74) *Attorney, Agent, or Firm*—Jonathan A. Small

(57) ABSTRACT

A plurality of vertically spaced-apart microsprings are provided to increase microspring contact force, contact area, contact reliability, and contact yield. The microspring material is deposited, either as a single layer or as a composite of multiple sub layers, to have a tailored stress differential along its cross-section. A lower microspring may be made to push up against an upper microspring to provide increased contact force, or push down against a substrate to ensure release during manufacture. The microsprings may be provided with similar stress differentials or opposite stress differentials to obtain desired microspring profiles and functionality. Microsprings may also be physically connected at their distal ends for increased contact force. The microsprings may be formed of electrically conductive material or coated with electrically conductive material for probe card and similar applications.

27 Claims, 15 Drawing Sheets

U.S. PATENT DOCUMENTS

| | | |
|---|---|---|
| 6,534,249 B2 | 3/2003 | Fork et al. |
| 6,560,861 B2 | 5/2003 | Fork et al. |
| 6,582,989 B2 | 6/2003 | Biegelsen et al. |
| 6,595,787 B2 | 7/2003 | Fork et al. |
| 6,606,235 B2 | 8/2003 | Chua et al. |
| 6,621,141 B1 | 9/2003 | Van Schuylenbergh et al. |
| 6,632,373 B1 | 10/2003 | Rosa et al. |
| 6,646,533 B2 | 11/2003 | Biegelson et al. |
| 6,655,964 B2 | 12/2003 | Fork et al. |
| 6,658,728 B2 | 12/2003 | Fork et al. |
| 6,668,628 B2 | 12/2003 | Hantschel et al. |
| 6,672,875 B1 * | 1/2004 | Mathieu et al. ............... 439/66 |
| 6,684,499 B2 | 2/2004 | Romano et al. |
| 6,734,425 B2 | 5/2004 | Hantschel et al. |
| 6,743,982 B2 | 6/2004 | Biegelsen et al. |
| 6,788,086 B2 | 9/2004 | Hantschel et al. |
| 6,794,725 B2 | 9/2004 | Lemmi et al. |
| 6,794,737 B2 * | 9/2004 | Romano et al. ............ 257/669 |
| 7,015,584 B2 * | 3/2006 | Chow et al. ................. 257/773 |
| 7,166,326 B1 * | 1/2007 | DiStefano ................... 427/270 |
| 7,230,440 B2 * | 6/2007 | Hantschel et al. ........... 324/762 |
| 2004/0022040 A1 * | 2/2004 | Sitaraman et al. ........... 361/772 |
| 2004/0102064 A1 * | 5/2004 | Mathieu ...................... 439/66 |
| 2004/0114259 A1 * | 6/2004 | Ishizuya et al. ............. 359/849 |
| 2005/0006829 A1 * | 1/2005 | Chow et al. ................... 267/74 |
| 2005/0121758 A1 * | 6/2005 | Di Stefano .................. 257/678 |
| 2006/0076693 A1 * | 4/2006 | Hantschel et al. ........... 257/784 |
| 2006/0242828 A1 * | 11/2006 | Kirby et al. ................... 29/874 |
| 2007/0069751 A1 * | 3/2007 | Hantschel et al. ........... 324/762 |
| 2007/0141742 A1 * | 6/2007 | Chua et al. ................... 438/48 |
| 2008/0095996 A1 * | 4/2008 | Chua et al. ................. 428/212 |

* cited by examiner

VERTICALLY SPACED PLURAL MICROSPRINGS

BACKGROUND OF THE INVENTION

1. Field of the Invention

The present invention relates generally to photolithographically patterned spring contacts, and more particularly to a plurality of such photolithographically patterned spring contacts vertically displaced from one another for use in electrically contacting integrated circuits, arrays, and the like.

2. Description of the Prior Art

Photolithographically patterned spring devices (referred to herein as "microsprings") have been developed, for example, to produce low cost probe cards, and to provide electrical connections between integrated circuits. Such microsprings are disclosed and described, for example, in U.S. Pat. No. 5,914,218, which is incorporated by reference herein. A microspring is generally a micrometer-scale elongated metal structure having a free (cantilevered) portion which bends upward from an anchor portion which is affixed directly or indirectly to a substrate. The microspring is formed from a stress-engineered metal film (i.e., a metal film fabricated to have a stress differential such that its lower portions have a higher internal compressive stress than its upper portions) that is at least partially formed on a release material layer. The free portion of the microspring bends away from the substrate when the release material located under the free portion is removed (e.g., by etching).

The stress differential is produced in the spring material by one of several techniques. According to one technique, different materials are deposited in layers, each having a desired stress characteristic, for example a tensile layer formed over a compressive layer. According to another technique a single layer is provide with an intrinsic stress differential by altering the fabrication parameters as the layer is deposited. The spring material is typically a metal or metal alloy (e.g., Mo, MoCr, W, Ni, NiZr, Cu), and is typically chosen for its ability to retain large amounts of internal stress. Microsprings are typically produced using known photolithography techniques to permit integration of the microsprings with other devices and interconnections formed on a common substrate. Indeed, such devices may be constructed on a substrate upon which electronic circuitry and/or elements have previously been formed.

Such microsprings may be used in probe cards, for electrically bonding integrated circuits, circuit boards, and electrode arrays, and for producing other devices such as inductors, variable capacitors, scanning probes, and actuated mirrors. For example, when utilized in a probe card application, the tip of the free portion of a microspring is brought into contact with a contact pad formed on an integrated circuit, and signals are passed between the integrated circuit and test equipment via the probe card (i.e., using the microspring as an electrical contact).

Microsprings typically terminate at a tip, spaced apart from the substrate. In certain applications, the microspring has a tip profile (e.g., an apical point) capable of physically penetrating an oxide layer that may form on the surface to which electrical contact is to be made. In order to provide a reliable contact with a surface to be contacted, the microspring must provide a relatively high contact force (the force which the spring applies in resisting a force oppositely applied from the surface to be contacted). This is particularly true in applications in which the apical point must penetrate an oxide layer. For example, most probing and packaging applications require a contact force on the order of 50-100 mg between the tip and the structure being contacted.

One problem faced by typical microsprings is the tradeoff made between contact force and spring geometry. In general the contact force at the tip of the microspring is given by:

$$F_{tip} = \frac{wh^2 \Delta\sigma}{12x}$$

where w is the width of the microspring, h is the thickness of the microspring, $\Delta\sigma$ is the total stress difference vertically across the cross-section of the microspring, and x is the distance from the microspring tip to the anchor. Thus, there are several ways to increase the microspring's contact force, but at the cost of altering the microspring geometry.

First, as one decreases the length (X) of the microspring one increases its contact force. However, it is critical that when released the microspring tip should be at a certain height above the substrate. The spring must also provide a certain amount of compliance in response to a downward force being applied by the surface to be contacted. Too short a microspring produces problematic contact and inadequate compliance. Thus, there is a limit to the extent that one can reduce microspring length to increase the contact force.

Second, one can increase the microspring thickness (h) to increase the contact force. However, thickness also affects the extent of curvature resulting from a stress differential, thus again affecting tip height and compliance. Above a certain thickness a microspring is incapable of reaching the design requirement for tip height, as well as sufficient compliance.

Third, one can apply a plating material (e.g., Ni) over a microspring after its release. However, the plating process risks damage to the microspring, and deposits material underneath the microspring, potentially interfering with the motion of the spring. During the plating process, microsprings tend to adhere to the substrate surface, affecting device yield. Furthermore, in order to sufficiently increase the contact force, the thickness and width of the plated microspring increases, and may lead to the disadvantage of reducing the number of springs per mm in an array (i.e., decreasing spring pitch) as well as the disadvantages associated with excessive cross-sectional thickness and width discussed previously.

Furthermore, typical microsprings curve upwards and terminate at the apical tip. This tip, whether patterned into a point or a flat edge perpendicular to the long axis of the microspring, tends to dig into the contact point of the structure being contacted. While this has some benefit, for example when attempting to pierce an oxide layer, it is detrimental when there is some variability in the location of the contact point or need to accommodate small amounts of relative motion between the microspring and the point of contact. In the later case, there is a desire for a microspring with a tip profile capable of accommodating lateral tip movement, for example as it is vertically displaced, in order to maintain continued contact with the contact point.

SUMMARY OF THE INVENTION

Accordingly, the present invention is directed to a novel design for a microspring, an array of microsprings, and a method of making same, which provides an improved contact force, improved control of spring tip height, controllable-profile spring geometry, and improved microspring yield as compared to microsprings heretofore available.

According to one aspect of the invention, a plurality of vertically displaced microsprings are formed over a substrate. The microsprings include tailored stress differentials such that upon release the microsprings assume a non-planar profile resulting from the stress differential. For example, a lower microspring may be caused to be in physical contact with and push upward on an upper microspring, or positioned such that when the upper microspring is deformed it physically contacts the lower microspring to provide increased contact force. The microsprings may be provided with opposite stress differentials such that the lowermost microspring tends to curve upward (i.e., has a negative stress differential) and the uppermost microspring tends to curve downward (i.e., has a positive stress differential). The stresses for the two microsprings may be individually adjusted by controlling the layer materials and/or deposition parameters used to form the microsprings.

According to another aspect of the invention, the two microsprings may each have a negative (or positive) stress differentials, with the lower microspring providing support for the upper microspring. The force resisting deflection for each microspring may be the same or may be different, so that the net contact force is higher, with a desired force-displacement profile.

According to yet another aspect of the invention, the upper and lower microsprings may be patterned such that upon their release they become interlocked with one another. Such interlocked dual microsprings are capable of providing a wide variety of force-displacement profiles.

According to a still further aspect of the invention, the upper and lower microsprings are bonded together. For example, a lowermost microspring may be bonded at its tip to a point on the spring arm of the uppermost microspring. Alternatively, the microsprings may be bonded together at their distal ends. This bonding may provide increased contact force, electrical interconnection between the two microsprings, and may also provide desired spring configurations such as a loop microspring.

The plurality of vertically displaced microsprings work together to provide a higher net contact force. With a lower microspring pushing upward on an upper microspring, greater tip height may be provided without need to extend the length of the microspring nor reduce the microspring's cross-sectional thickness. The ability to use a lower microspring to selectively push upwards on an upper microspring also facilitates controlling the cross-section of the resulting spring structure (e.g., the ability to provide non-circular profiles). Finally, improved spring contact force can be provided without having to plate the microsprings, thus yield may be improved. Furthermore, plating adds material to the width of the microsprings, affecting the pitch (e.g., number of springs per mm) in an array of microsprings. (Regardless, however, plating may be employed in any of the embodiments of the present invention, for example to further increase the contact force, if desired.)

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE INVENTION

Figure 1:
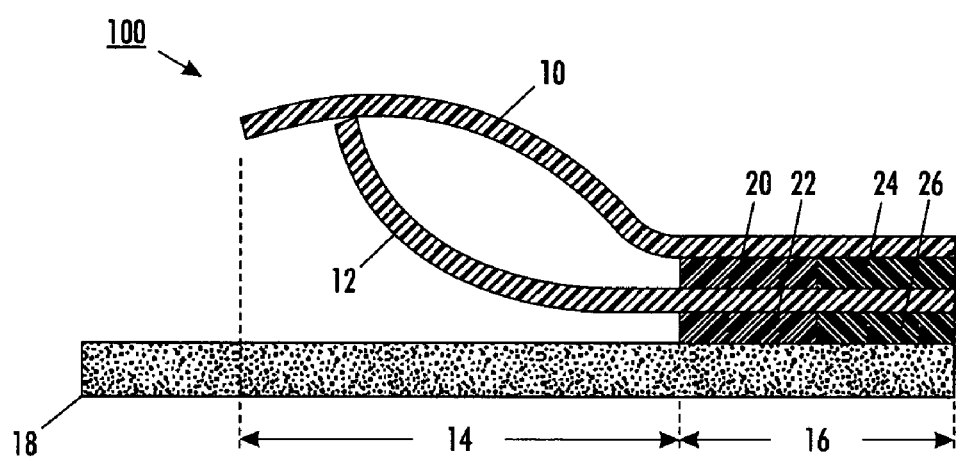
FIG. 1 is a profile view of a vertically spaced plural microspring structure according to an embodiment of the present invention.

Shown in FIG. 1 is a side view of one embodiment of a microspring structure 100 having a plurality of microsprings such as upper microspring 10 and lower microspring 12. Each microspring 10, 12 comprises a free portion 14 and an anchored portion 16 fixed to a substrate 18 (e.g., glass, silicon, quartz, etc.) at an anchor 20, 22, respectively. Optionally, microsprings 10, 12 may be electrically connected to a contact pad 24, 26, respectively. Alternatively, contact pads 24, 26 may be formed under anchors 20, 22, with vias or other means for making electrical contact with microsprings 10, 12 formed in or on anchors 20, 22 (not shown). Furthermore, anchor 20 and contact pad 24 may be a single component, and likewise anchor 22 and contact pad 26 may also be a single component. Anchor 20, together with contact pad 24 when employed, form a spacing layer, serving among other purposes to space the upper and lower microsprings 10, 12 apart from one another. For clarity of explanation, the following discussion assumes that anchor 20 and contact pad 24 are a single component, and likewise anchor 22 and contact pad 26 are also a single component.

Each microspring 10, 12 is made of an elastically deformable material, such as a molybdenum-chrome (MoCr) alloy, a nickel-zirconium (NiZr) alloy, etc. Preferably, the material from which microsprings 10, 12 are formed is electrically conductive, although one or both can be formed of a non-conductive or semi-conductive material. If formed of a non-conductive or semi-conductive material, at least upper microspring 10 may be coated or plated with an electrically conductive material. Microsprings 10, 12 may be formed of the same material, may be formed of layers of materials, each microspring comprising the same layer order and constituents, or may be formed of different materials or different material layers and/or layer order. In addition to MoCr and NiZr alloys, microsprings 10, 12 may be any of a variety of metals or alloys suitable for the creation of microsprings, such as Mo, MoCr, W, Ni, NiZr, or Cu (or a non metal), or other oxides, nitrides, diamond, or organic material.

Figure 2A:
FIGS. 2A through 2I are profile views of the process of forming a vertically spaced microspring structure according to an embodiment of the present invention.

With reference now to FIG. 2A through 2I, there is illustrated therein a first embodiment of a process for the production of a plurality (e.g., two) of vertically spaced microsprings according to the present invention. With reference initially to FIG. 2A, a first contact and anchor layer 32 is formed of Ti on or over a silicon, glass, quartz or a polymer such as polyimide substrate 30. Optionally, substrate 30 may have previously formed thereon electronic components and/or circuitry (not shown), or alternatively substrate 30 may be a printed circuit board or printed wiring board. First contact and anchor layer 32, as well as subsequent layers of the plural microspring structure, may be formed by sputtering, plating, evaporation, chemical vapor deposition (CVD), plasma-enhanced CVD (PECVD) or material transfer through bonding and release. An optional insulating underlayer (not shown) may then be deposited and patterned in applications in which electrical insulation is desired between the microspring and other elements of the final plural microspring structure.

Figure 2B:
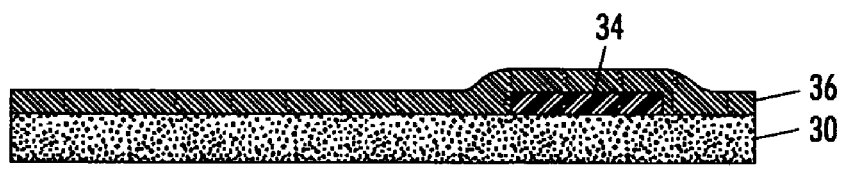
Figure 2C:

As shown in FIG. 2B, first contact and anchor layer 32 is next patterned by photolithographic techniques well known in the art in order to form first contact and anchor pad 34. First release layer 36, formed of materials known and used in stressed metal applications, such as Ti, Ni, $SiO_2$, SiN, $SiO_xN_y$, or Si is then deposited over the structure, which is then photolithographically patterned to form first release island 38, shown in FIG. 2C. A first material system 40 is next deposited over the structure, then photolithographically patterned. Ultimately, first material system 40 becomes the lowermost of the plural microsprings 42 when released. Accordingly, first material system 40 may be any of a variety of metals or alloys suitable for the creation of microsprings, such as Mo, MoCr, W, Ni, NiZr, or Cu (or a non metal).

First material system 40 is deposited in such a way as to develop within the layer a stress differential in a vertical direction across the layer's cross-section. That is, the stress in the system varies from bottom to top. According to one embodiment, first material system 40 comprises a single layer of material, and the gas pressure or power is varied during the deposition process to create a stress-engineered single layer (i.e., a layer comprised of a single material) having a desired cross-sectional stress differential. According to another embodiment, first material system 40 is itself comprised of a number of sub-layers, each sub-layer having a desired intrinsic stress. When properly selected, the assembly of sub-layers mechanically and electrically functions as a single system, but the bulk stress differential across the system of layers is a composition of the individual stresses of the sub-layers. These techniques are further described in U.S. Pat. No. 5,613,861, which is incorporated by reference herein, as well as in previously discussed U.S. Pat. No. 5,914,218. While formed in a plane, the result of the stress in system 40 is that when the layer is patterned into lowermost microspring 42, then released from the substrate by removal of first release island 38, the microspring bends into a non-planar profile to form a desired spring shape, such as a circular curvature upward. The released structure is discussed further below.

Figure 2D:
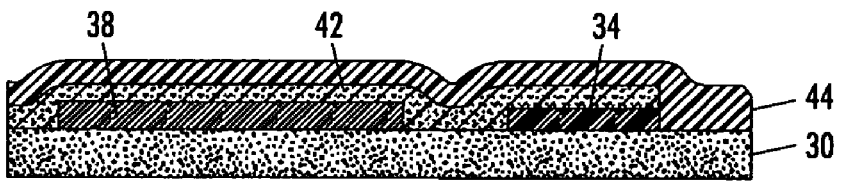
Figure 2E:
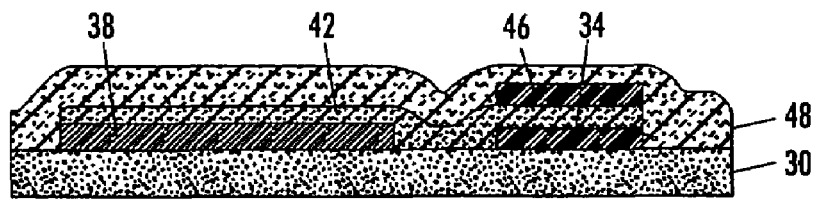
Figure 2F:
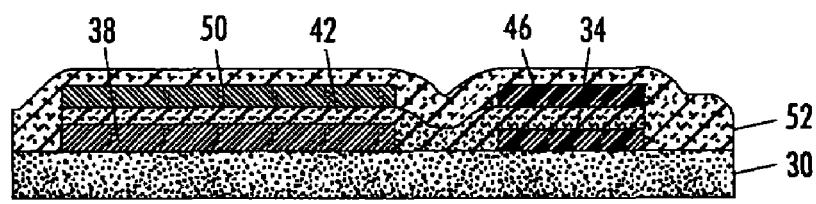
Figure 2G:
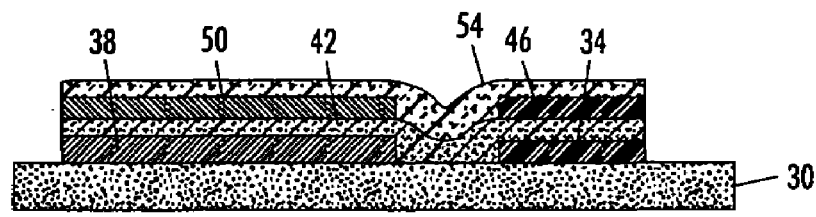

With reference now to FIG. 2D, second contact and anchor layer 44, formed for example of Ti (it may be but is not necessarily formed of the same material as that of layer 32) is deposited over the structure. As shown in FIG. 2E, second contact and anchor layer 44 is then patterned to become second contact and anchor pad 46. Second release layer 48, formed of material similar to that comprising first release layer 36, is then deposited over the structure. As shown in FIG. 2F, release layer 48 is then photolithographically patterned to form second release island 50. Finally, a second material system 52 is formed over the structure. As shown in FIG. 2G, second material system 52 is then photolithographically patterned, and becomes the uppermost of the plural microsprings 54 when released. Accordingly, second material system 52 may also be any of a variety of metals or alloys suitable for the creation of microsprings, such as Mo, MoCr, W, Ni, NiZr, or Cu, (or a non metal) and may be the same material or a different material than that forming lowermost microspring 42. Furthermore, similar to first material system 40, second material system 52 may also be formed with an intrinsic stress differential from bottom to top along its cross-section or as a system of sub-layers, each sub-layer having a desired intrinsic stress such that the system acting as a whole, when released, provides the desired non-planar profile to microspring 54.

Figure 2H:
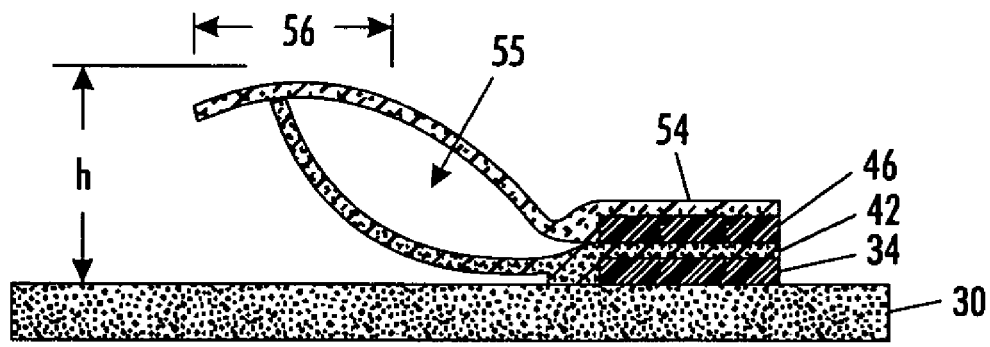

As illustrated in FIG. 2H, the structure is next etched to remove first release island 38 and second release island 50. With these release islands removed, a portion of each of lowermost microspring 42 and uppermost microspring 54 are released from surface contact with layers above and below. Thereafter, the stress in each of lowermost microspring 42 and uppermost microspring 54 cause each of the microsprings to curve out of the plane in which they were formed. The nature of the stress in each microspring determines the direction, profile, and extent of the curve induced in the microspring. For example, microspring 42 may be fabricated with a negative stress differential, meaning that prior to its release the stress goes from compressive at a lower edge to tensile at an upper edge, when viewed in cross-section. This stress differential will produce an upward curvature to microspring 42 when release layer 38 is removed by etching. Furthermore, microspring 54 may be fabricated to have a positive stress differential prior to release, meaning that prior to its release the stress varies from tensile at a lower edge to compressive at an upper edge, when viewed in cross-section. This stress differential will produce a downward curvature to microspring 54 when release layer 50 is removed by etching. These two stress differentials are said to be opposite to one another, since they result in curvature of the microsprings in opposite directions.

By properly selecting the lengths and thicknesses of the free portions of microsprings 42, 54, and the stress differentials in each, it is possible to produce a structure in which the released free portion of lowermost microspring 42 mechanically and electrically engages the released free portion of uppermost microspring 54, the former providing elastically deformable support for the later, thereby increasing the contact force which may be provided by microspring 54. FIG. 2J is a micrograph of such a structure.

One consequent advantage of the embodiment described above is that the lowermost microspring 42 can exert sufficient force upon uppermost microspring 54 that tip height, h, may be significantly increased over prior designs. For example, the lowermost microspring may provide sufficient force to cause the uppermost microspring to become oriented virtually normal to the plane of the substrate, as illustrated in the micrograph of FIG. 2K. Tip heights on the order of 50-1000 μm may be achieved by this technique.

Figure 2I:
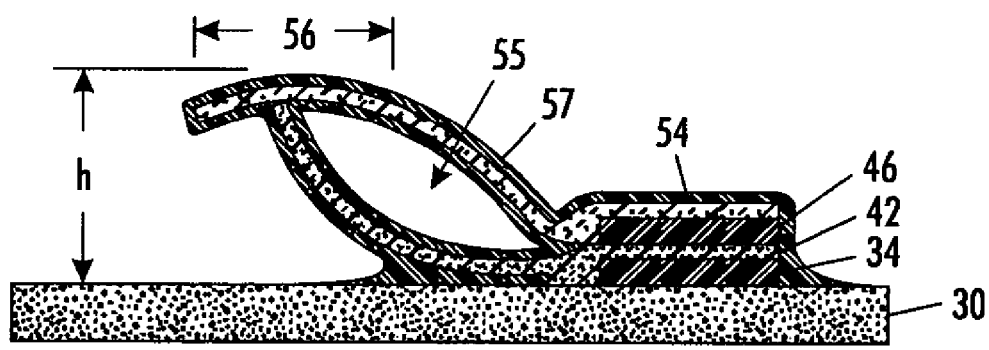
Figure 2J:
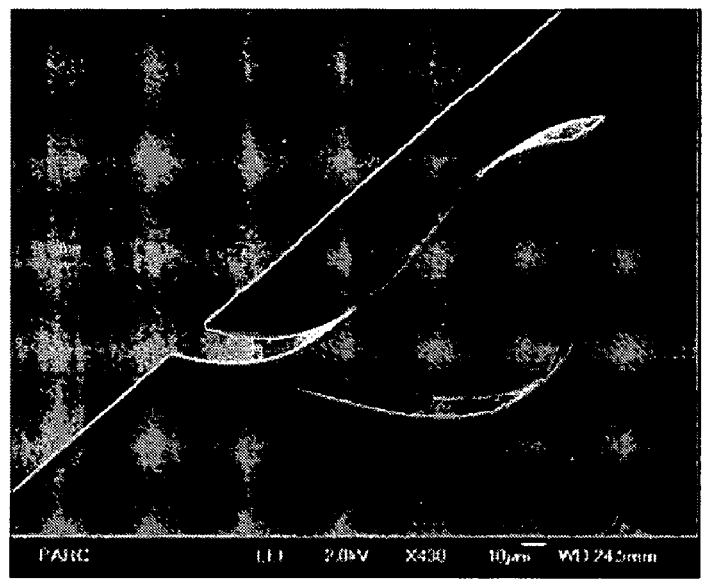
FIGS. 2J through 2K are micrographs of a vertically spaced microspring structure according to an embodiment of the present invention.
Figure 2K:
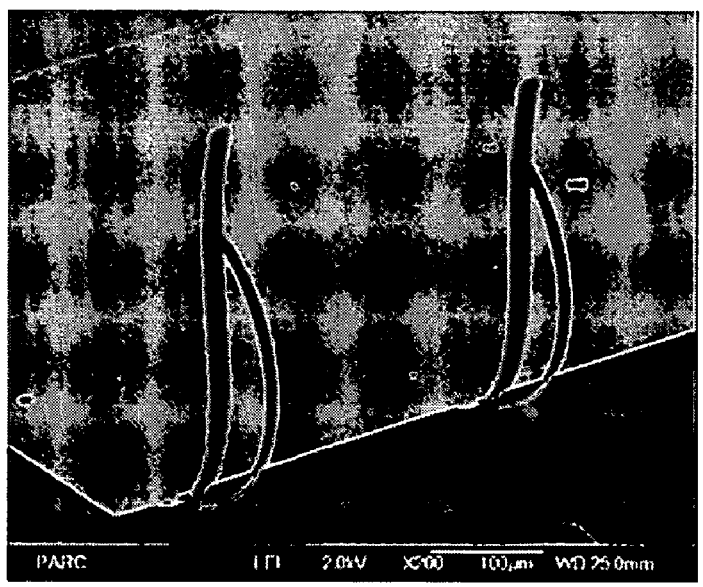

Optionally, as shown in FIG. 2I, the structure may then be plated to form a conductive metal layer 57 on the exposed surfaces of microsprings 42, 54. This overplating technique is known for single microspring applications to obtain desirable spring characteristics, such as increased spring stiffness, hardness, wear resistance, and improved electrical conductivity. Such overplating may also rigidly affix lowermost microspring 42 to uppermost microspring 54, creating a clamped structure with still higher contact force. Any of a wide variety of conductive plating materials may be employed, and as known, a gold or similar seed layer (not shown) may be used to improve the plating adhesion and reduce oxidation prior to plating. Furthermore, the plating process may proceed to such a degree that the open region 55 between lowermost microspring 42 and uppermost microspring 54 becomes filled with plating material. This arrangement produces an exceptionally "thick" spring, particularly when compared to its width, and provides a relatively high resistance to deflection upon contact.

Figure 2L:
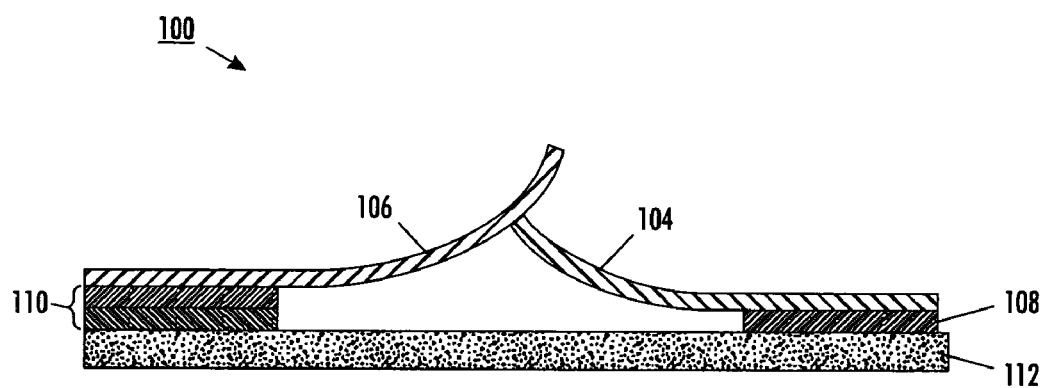
FIG. 2L is a profile view of a vertically spaced plural microspring structure according to another embodiment of the present invention.

In addition, while the vertically displaced microsprings disclosed above have anchor pads formed directly atop one another, in certain applications it may be desirable to both vertically and laterally dispose the anchor pads apart from one another. In this embodiment, while the microsprings vertically overlap one another, the microsprings "point" towards one another. Such an arrangement 102 is shown in FIG. 2L, in which two microsprings 104, 106 have their respective anchor pads 108, 110, formed opposite one another on substrate 112.

Figure 3:
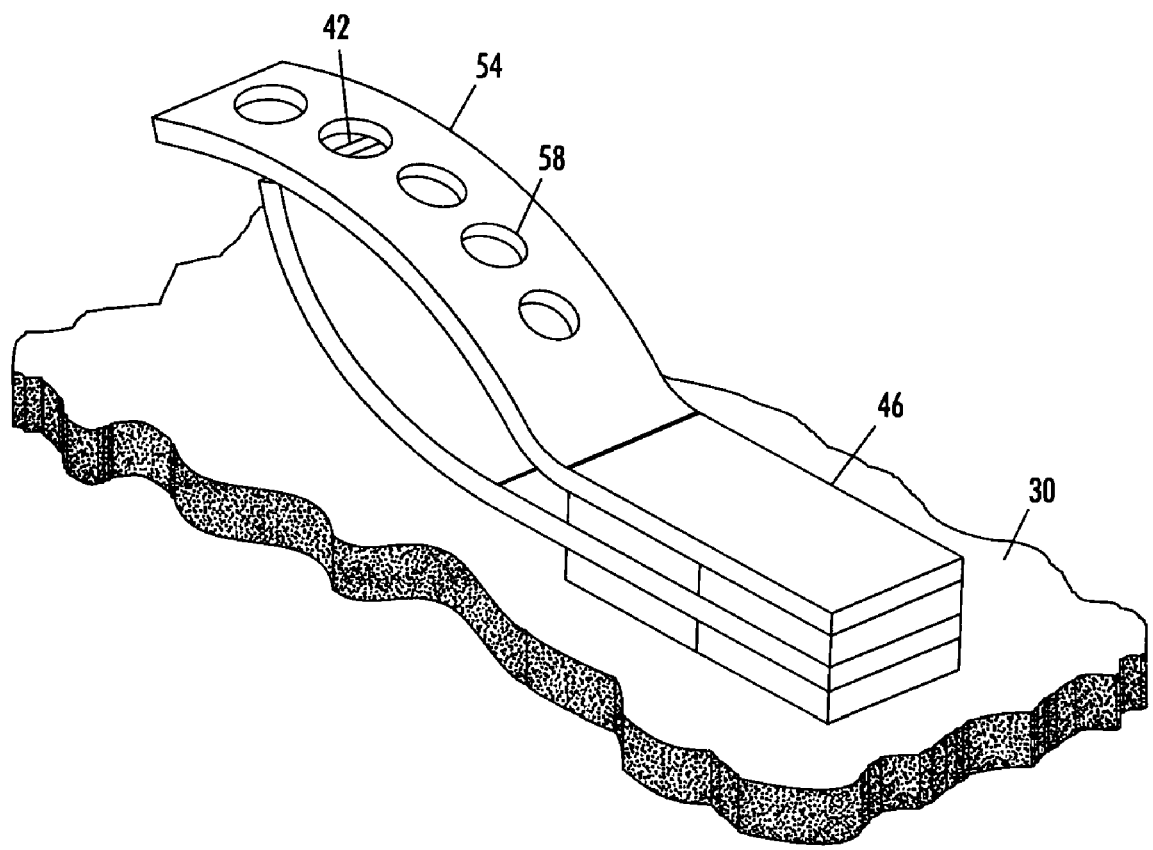
FIG. 3 is a profile view of a vertically spaced plural microspring structure according to an embodiment of the present invention in which the microspring body has material removed therefrom.

Another consequent advantage of the embodiment described above is that there is a reduced probability of microsprings sticking to the substrate during release. This problem, called stiction, which regularly occurs in prior art structures, is often caused by surface wetting and surface tension during the release step and post etch cleaning. According to the present invention, the two microsprings 42, 54 work together, due to their respective stress differentials, to overcome stiction. The gap that will typically form between the plural vertically displaced microsprings further assists in reducing surface area and hence stiction. In addition, the planar surfaces of one or both of microsprings 42, 54 may be perforated or provided with openings 58 of varying shape, as shown in FIG. 3, to still further reduce surface area and hence reduce stiction.

Figure 4:
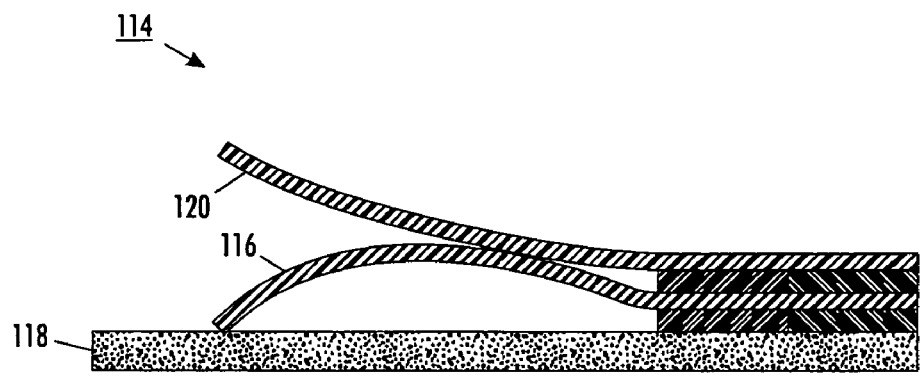
FIG. 4 is a profile view of a vertically spaced plural microspring structure according to yet another embodiment of the present invention in which the microsprings have oppositely-oriented stress differentials.

FIG. 4 illustrates another embodiment 114 which beneficially overcomes stiction. According to this embodiment, lowermost microspring 116 may be formed to have a positive stress differential, which causes that microspring to curve downward toward substrate 118, while the uppermost microspring 120 is formed with a negative stress differential which causes it to curve upward for contact. The bow produced by lowermost microspring 116 both overcomes stiction and provides additional contact force to the uppermost microspring 120.

A still further advantage of the embodiment described above is that the lowermost microspring 42 and uppermost microspring 54 may each have different thicknesses and planform geometries. Thus, in addition to selecting stress differentials for each microspring, these attributes may be selected to tailor the contact force, contact height, contact area, electrical conductivity, etc. provided by the microsprings. For example, lowermost microspring 42 may have a relatively short anchor-to-tip length to provide high contact force, and uppermost microspring 54 may have a relatively long anchor-to-tip length to provide a large contact surface or increase tip height.

An arrangement in which the vertically displaced microsprings each have a different geometry generally dictates that each layer be patterned after its deposition and before deposition of the layer above it. However, in those cases in which lowermost microspring 42 and uppermost microspring 54 have the same geometry, the various layers described above may be deposited one after the other, and the final multi-layered structure photolithographically patterned, then etched to release the microsprings.

While it will be common for there to be electrical contact between lowermost microspring 42 and uppermost microspring 54, according to other embodiments it may be desirable to electrically isolate lowermost microspring 42 and uppermost microspring 54. In such a case, an insulative layer (not shown) may be deposited between the first material system 40 and second material system 52, for example, below second release layer 50, during fabrication. This insulative layer may be patterned to provide electrical isolation between the lowermost microspring 42 and uppermost microspring 54 in the region nearest contact and anchor pads 34, 46 or elsewhere. In addition, multiple insulative layers may be applied to isolate additional numbers of microsprings and other structures formed on the substrate.

Figure 5:
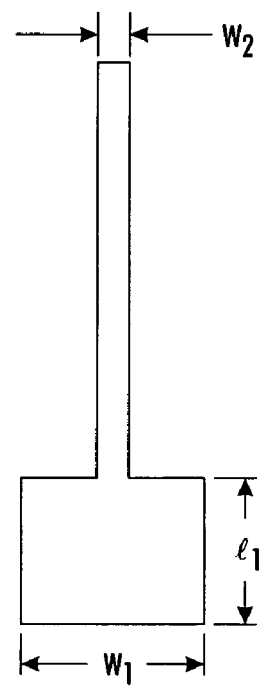
FIG. 5 is a planform view of a microspring structure with contact pad according to still another embodiment of the present invention.

According to the foregoing, each layer of the device was deposited in bulk, photolithographically patterned, then etched prior to the deposition of the layer above it. While such a method provides precise control over the geometries of the elements forming the microspring structure, it also requires a large number of different masks and masking and etching steps. Therefore, an alternative to the foregoing is to deposit the bulk layers one after another, pattern the uppermost layer, then etch downward through the various layers. In this embodiment, the materials for the various layers described above are selected in part for their etch rates, such that the release layers etch more quickly than the metal layers. Furthermore, first contact and anchor pad 34 (FIG. 2B) and second contact and anchor pad 46 (FIG. 2E) are typically patterned to have a width, $w_1$, and length $l_1$, which are greater than the width of a microspring $w_2$, as shown in FIG. 5 in order to preserve the bond provided by the anchor pads post etch. For a properly timed etch, the release material underlying the microsprings is completely removed while sufficient anchor material remains for a mechanical bond to the substrate or layers formed thereover. Openings formed in the microsprings, such as openings 58 shown in FIG. 3, also assist in selectively etching the release material more rapidly than the microspring material.

Figure 6A:
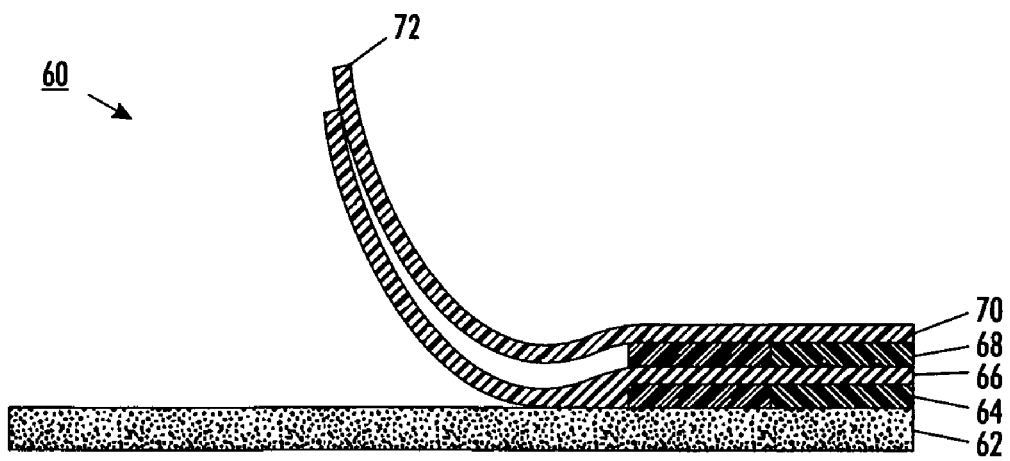
FIGS. 6A and 6B are a profile view and top view, respectively, of a vertically spaced plural microspring structure according to an embodiment of the present invention having a shaped apical tip.
Figure 6B:
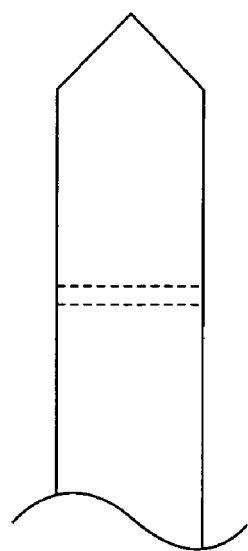
Figure 6C:
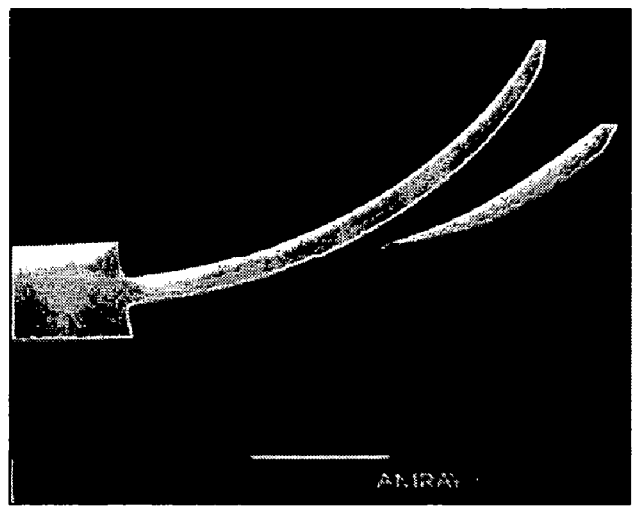
FIGS. 6C and 6D are micrographs of another embodiment of a vertically spaced plural microspring structure according to the present invention, the microsprings having similarly-oriented stress differentials.
Figure 6D:
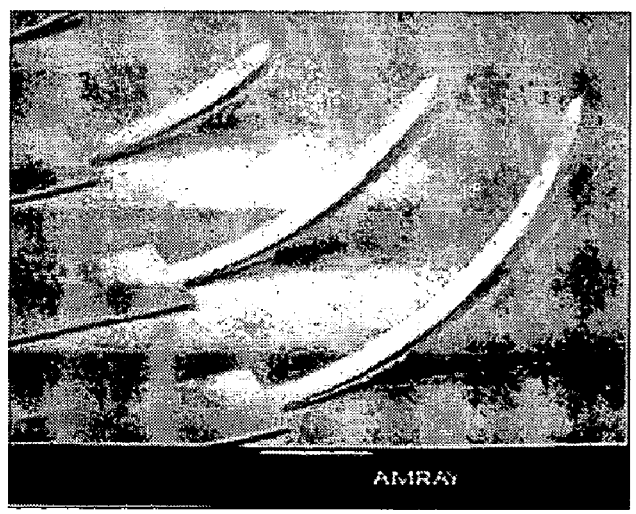

According to the embodiment shown in FIG. 2H, the structure provides a rounded surface, or "skid" 56 for contact with a surface to be contacted. Skid 56 permits lateral translation of the microspring under compression and ensures contact between the microspring and the surface to be contacted for different angles for improved contact reliability and quality without spring buckling. However, a wide variety of tip geometries and functionalities may be provided by the plural microspring structure disclosed and taught herein. For example, with reference to FIG. 6A, there is shown therein a dual microspring structure 60 formed on a substrate 62. Structure 60 includes a first contact and anchor pad 64, a lowermost microspring 66, a second contact and anchor pad 68, and an uppermost microspring 70, similar to the embodiment shown in FIG. 2H. The stress differentials for each of the microsprings in this embodiment are negative. Accordingly, the curvature of both microsprings 66, 70 is the same. However, the degree of stress in the two microspring layers was selected such that lowermost microspring 66 achieves a greater curvature than uppermost microspring 70, resulting in the former being in mechanical and electrical contact with the later despite the same direction of curvature. In this embodiment, the tip 72 of microspring 60 is oriented for presentation to a region to be contacted. Accordingly, any number of tip designs, such as the apical, chisel point tip shown in FIG. 6B, designs such as disclosed in the aforementioned U.S. Pat. No. 5,613,861, etc. may be employed. Alternatively, such tip designs may also be provided on microsprings having nearly identical stress differentials, such as illustrated in the micrographs of FIGS. 6C and 6D.

Figure 7A:
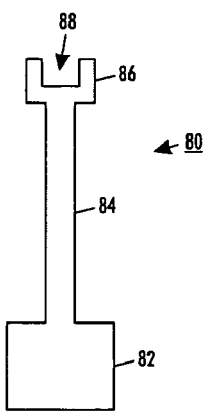
FIG. 7A is a top or planform view, FIG. 7B of a close-up tip micrograph view.
Figure 7B:
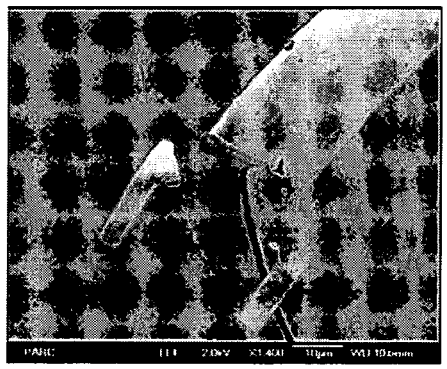
FIG. 7C is a standard micrograph view of an embodiment of a vertically spaced plural microspring structure having an engagement mechanism according to the present invention.
Figure 7C:
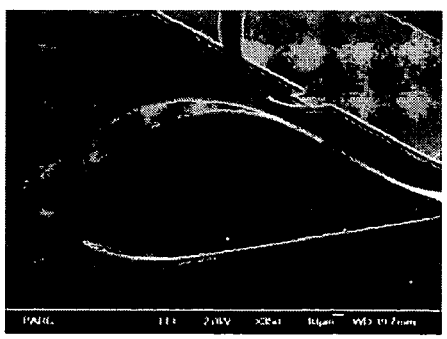

According to another embodiment of the present invention, each microspring is provided with a feature which allows mechanical interconnection with another such microspring. The interconnection features may allow for stopped or unstopped slidable interconnection or fixed interconnection. For example, with reference to FIG. 7A, there is shown therein microspring 80 in its unreleased state. According to this embodiment, microspring 80 is provided with an anchor region 82, and a spring arm 84 having at one end thereof an engagement tip 86 which includes a spring arm receiving slot 88. When two such microsprings are vertically disposed proximate one another, the lowermost microspring having a negative stress differential and the uppermost microspring have a positive stress differential, and released from the substrate as disclosed above, the spring arm 84 of the lowermost microspring engages into the receiving slot of the uppermost microspring. The tips of two engaged microsprings are shown in close-up micrograph in FIG. 7B. FIG. 7C shows a complete spring structure using this interlocking mechanism. This embodiment permits relative vertical and one-directional lateral motion between the two microsprings, and limits a second lateral directional deflection of the one microspring relative to the other. More controlled and uniform spring action is thereby provided. A noteworthy advantage provided by this embodiment is that only a single masking step, with etching of the top and bottom microsprings, is required to produce the interlocking structure.

Figure 8A:
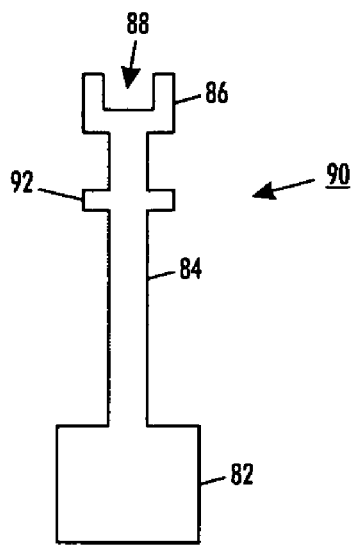
FIG. 8A is a top or planform view.
Figure 8B:
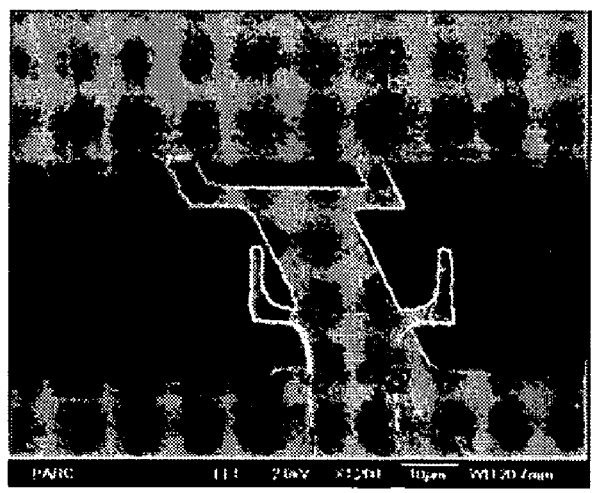
FIG. 8B is a close-up tip micrograph view of an embodiment of a vertically spaced plural microspring structure having an engagement and stop mechanism according to the present invention.
Figure 8C:
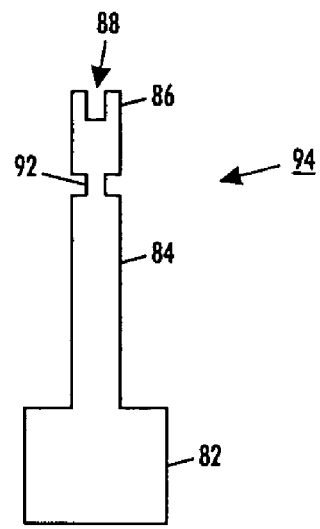
FIG. 8C and FIG. 8D are top or planform views of alternate embodiments of a vertically spaced plural microspring structure having an engagement and stop mechanism according to the present invention.
Figure 8D:
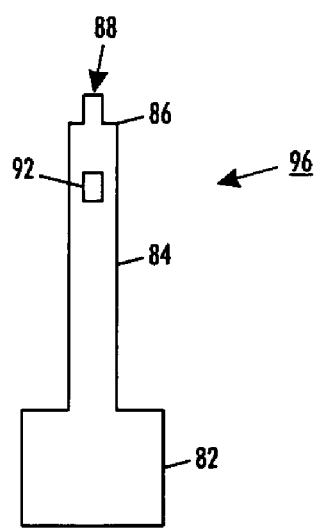

According to another embodiment of the present invention, a microspring 90, similar to that described with reference to FIG. 7A, may be provided with a slide stop 92, shown in FIG. 8A, to limit the relative motion of the two microsprings. The result is to provide a "clamped" contact force in response to vertical displacement. That is, the microsprings slide relative to one another up to a point, providing a first level of contact force, then, when engagement tip 86 buts up against slide stop 92, the microspring provides a second level of contact force which is greater than the first level of contact force. FIG. 8B is a micrograph of the engaged spring arm 84 and engagement tip 86 of two such microsprings. FIGS. 8C and 8D illustrate two further variations 94, 96 of the above embodiment, in that the engagement tip 86 and slide stop 92 do not protrude from the spring arm 84, but rather are notched into spring arm 84.

Figure 9A:
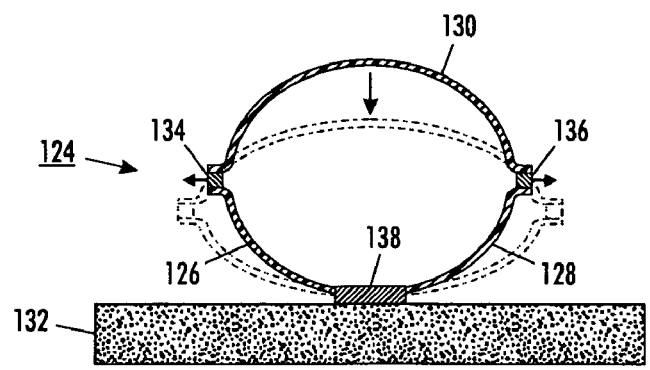
FIG. 9A is a profile view of a first embodiment of a clamped microspring structure according to the present invention.

Finally, according to another embodiment of the present invention, the plurality of microsprings may be clamped together at their free ends to produce desirable structures. For example, FIG. 9A illustrates a loop contact 124, comprised of first microspring 126, second microspring 128, and third microspring 130, formed on substrate 132. First microspring 126 is physically and electrically connected to third microspring 130 by first junction 134. Likewise, second microspring 128 is physically and electrically connected to third microspring 130 by second junction 136. Loop contact 124 is formed by forming first microspring 126 and second microspring 128, having a common anchor pad 138, but oriented to face away from one another, over a release layer (not shown). First microspring 126 and second microspring 128 are formed to have a negative stress differential. A release layer is formed thereover, then third microspring 130 is formed above first microspring 126 and second microspring 128. Third microspring 130 may optionally be formed to have a positive (or negative) stress differential. Vias may be opened and material introduced into those vias in order to form first and second junctions 134, 136. The release layers are thereafter removed, causing first microspring 126 and second microspring 128 to bow upwards off the substrate, and third microspring 130 to bow downward toward the substrate. When vertically deflected by contact with another structure, third microspring 130 deflects downward, resisted by the contact force provided by first microspring 126, second microspring 128, and third microspring 130, acting as a single unit connected by junctions 134, 136.

Figure 9B:
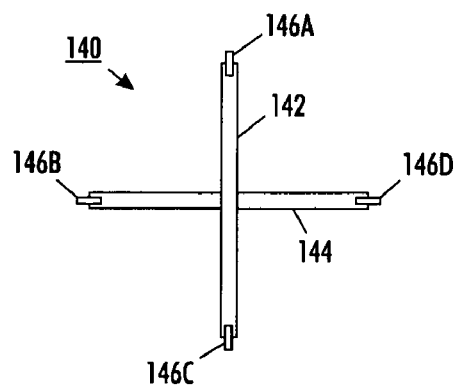
FIG. 9B and FIG. 9C are top or planform views of alternate embodiments of a clamped microspring structure according to the present invention.
Figure 9C:
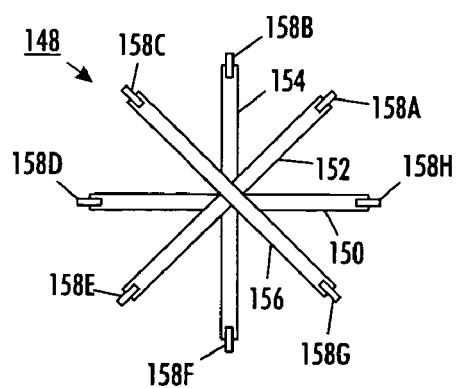
Figure 10:
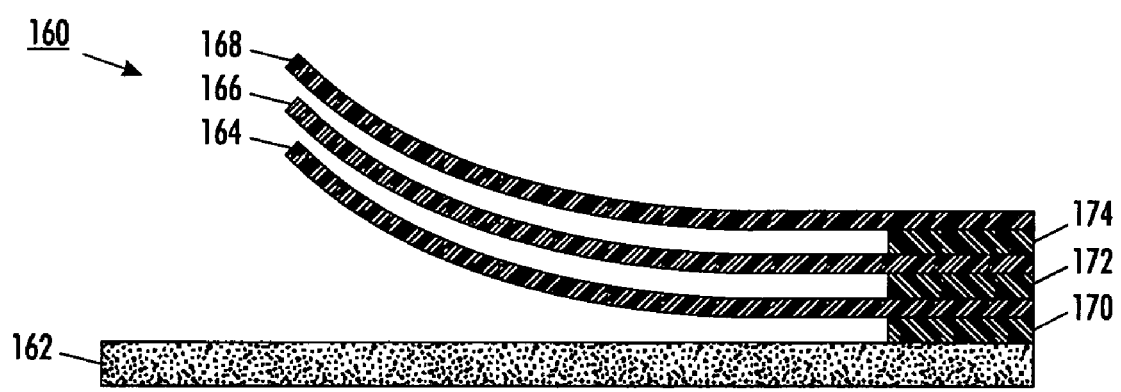
FIG. 10 is a profile view of a vertically spaced plural microspring structure according to another embodiment of the present invention.

FIG. 9B illustrates a top view of a structure 140 similar to that described above with reference to FIG. 9A, but including two loop contacts 142, 144, oriented roughly perpendicularly and clamped at their ends by junctions 146*a*, 146*b*, 146*c*, and 146*d*. FIG. 9C also illustrates a top view of a structure 148 similar to that described above with reference to FIG. 9A, but including four loop contacts 150, 152, 154, 156 (indeed, larger numbers of such contacts may also be formed) clamped at their ends by junctions 158*a*, 158*b*, 158*c*, 158*d*, 158*e*, 158*f*, 158*g*, and 158*h*. Alternating layers of microspring material and release material are required to construct such structures, as will be apparent to one of ordinary skill in the art given the present disclosure.

While a plurality of preferred exemplary embodiments have been presented in the foregoing detailed description, it should be understood that a vast number of variations exist, and that these preferred exemplary embodiments are merely representative examples, and are not intended to limit the scope, applicability or configuration of the invention in any way. For example, the above description has described embodiments well suited to sputter deposition techniques. However, selective deposition through patterned resist mask techniques may also be used to construct plural microspring structures of the types discussed herein by way of plating processes. In addition, each of the embodiments described above have included two microsprings. However, the disclosure herein is equally applicable to structures including more than two microsprings, each such microspring having similar or unique geometry, composition, and stress differential, such as shown in FIG. 10. Accordingly, the foregoing detailed description provides those of ordinary skill in the art with a convenient guide for implementation of the invention, and contemplates that various changes in the functions and arrangements of the described embodiments may be made without departing from the spirit and scope of the invention defined by the following claims thereto.

What is claimed is:

1. A spring contact structure, comprising:
a substrate;
a first microspring comprising an anchor portion and a free portion, the anchor portion being fixed to said substrate, in the absence of an external force applied to said first microspring the free portion of said first microspring having a non-planar profile, the free portion being free to move relative to said substrate;
a spacing layer; and
a second microspring comprising an anchor portion and a free portion, in the absence of an external force applied to said first microspring the free portion of said first microspring having a non-planar profile, a portion of said second microspring vertically disposed apart from said first microspring by said spacing layer, the anchor portion being fixed to said spacing layer and the free portion being free to move relative to said substrate, said second microspring located and shaped such that, in the absence of an external force applied to each of said first and second microsprings, said second microspring is in physical contact with said first microspring.

2. The spring contact structure of claim 1, wherein at least the first or second microspring is formed of an electrically conductive material.

3. The spring contact structure of claim 1, further comprising an electrically conductive layer formed on at least a portion of an outer surface of at least the first or second microspring.

4. The spring contact structure of claim 1, wherein for at least the first or second microspring the anchor portion thereof is electrically connected to a first contact formed over the substrate and the free portion thereof is capable of compliantly electrically contacting a second contact formed over a second substrate.

5. The spring contact structure of claim 1, wherein in the absence of an external force applied to said first and second microsprings, said first microspring has a first intrinsic stress differential such that the non-planar profile of said first microspring results therefrom, and said second microspring has a second intrinsic stress differential opposite to said first stress differential such that the non-planar profile of said second microspring results therefrom.

6. The spring contact structure of claim 1, wherein in the absence of an external force applied to said first and second microsprings, said first microspring has a first intrinsic stress differential and said second microspring has a second intrinsic stress differential, said first and second intrinsic stress differentials being substantially the same.

7. The spring contact structure of claim 1, wherein the first microspring is in physical and electrical contact with said second microspring.

8. The spring contact structure of claim 1, wherein the anchor portion of the first microspring and the anchor portion of the second microspring are substantially aligned vertically over one another.

9. The spring contact structure of claim 8, wherein the geometry of the free portion of the first microspring and the geometry of the free portion of the second microspring are substantially similar.

10. The spring contact structure of claim 1, wherein at least a portion of the body of the first microspring or the second microspring is removed.

11. The spring contact structure of claim 1, wherein at least the first or second microspring is provided with an engagement structure for physically engaging the other microspring.

12. The spring contact structure of claim 11, wherein both the first and second microsprings are provided with an engagement structure for physically engaging the other microspring.

13. The spring contact structure of claim 11, wherein the at least first or second microspring is provided with an engagement structure further comprising a notch in a distal end of the microspring of sufficient size to accept an engagement region of the other microspring.

14. The spring contact structure of claim 13, wherein the other microspring is further provided with a stop mechanism to limit motion of the engagement structure along the length of the engagement region.

15. The spring contact structure of claim 1, further comprising a third microspring disposed vertically spaced apart from said first and second microsprings, said third microspring located and shaped such that in the absence of an external force applied to said first, second, and third microsprings, said third microspring is in physical contact with at least said first or second microspring, said third microspring having a third intrinsic stress differential in a free portion thereof, the free portion having a non-planar profile in the absence of an external force applied thereto.

16. The spring contact structure of claim 1, wherein a distal end of said first microspring is physically bonded to a portion of said second microspring.

17. The spring contact structure of claim 1, wherein said first microspring is comprised of a plurality of layers, each layer having a different intrinsic stress when fabricated, the intrinsic stresses of each layer working together to establish said first intrinsic stress differential.

18. The spring contact structure of claim 17, wherein said second microspring is comprised of a plurality of layers, each layer having a different intrinsic stress when fabricated, the intrinsic stresses of each layer working together to establish stress differential.

19. The spring contact structure of claim 1, wherein said first microspring is comprised of a single layer having a varying intrinsic stress differential across its elevation.

20. The spring contact structure of claim 19, wherein said second microspring is comprised of a single layer having a varying intrinsic stress differential across its elevation.

21. A spring contact structure, comprising:
a substrate;
a first microspring comprising an anchor portion and a free portion, the anchor portion being fixed to said substrate and bending out of the plane of said substrate such that the spacing between said free portion of said first microspring and said substrate is different than the spacing between said anchor portion of said first microspring and said substrate, said free portion of said first microspring being free to move relative to said substrate, being caused by;
a spacing layer; and
a second microspring comprising an anchor portion and a free portion, the anchor portion being vertically aligned with and spaced apart from said anchor portion of said first microspring by, and fixed to, said spacing layer, said second microspring bending out of the plane of said substrate such that the spacing between said free portion of said second microspring and said substrate is different than the spacing between said anchor portion of said second microspring and said substrate, said free portion being free to move relative to said substrate; and said first microspring and said second microspring further being located such that said first microspring is in physical contact with said second microspring.

22. The spring contact structure of claim 21, wherein the first and second microsprings are formed of an electrically conductive material.

23. The spring contact structure of claim 22, wherein the first and second microsprings are electrically connected to a first contact formed over the substrate and the free portions of the first or second microsprings are capable of compliantly electrically contacting a second contact formed over a second substrate.

24. The spring contact structure of claim 21, wherein said second microspring further comprises a spring arm and said distal end of said first microspring is provided with an engagement notch of a width sufficient to accept the spring arm of said second microspring.

25. The spring contact structure of claim 23, wherein the spring arm of said second microspring is further provided with a laterally oppositely extending tabs which act as a stop mechanism to limit motion of the engagement notch along the length of the spring arm.

26. The spring contact structure of claim 21, wherein a distal end of said first microspring is physically bonded to a portion of said second microspring.

27. A spring contact structure, comprising:

a substrate;

a first and second oppositely extending microsprings, said first and second microsprings comprising a common anchor portion, independent free portions, each said first and second microsprings further comprising distal ends opposite said anchor portion and first and second intrinsic stress differentials, respectively, such that said anchor portion is in physical contact with said substrate and said free portions are free to move over said substrate, in the absence of an external force applied to each of said first and second microsprings, said first and second microsprings are non-planer, and further such that together said first and second microsprings form a concave structure;

a third microspring having a third intrinsic stress differential vertically spaced apart from said first and second microsprings, but aligned with said first and second microsprings such that a first distal end of said third microspring is in physical and electrical contact with and bonded to said distal end of said first microspring, and a second distal end of said third microspring is in physical and electrical contact with and bonded to said distal end of said second microspring, in the absence of an external force applied to said third microspring, said third microspring is non-planar, and further such that said third microspring forms a convex structure;

whereby said first, second, and third structures bonded at their respective distal ends together form a loop contact spring structure.

* * * * *